United States Patent
Devlin et al.

(10) Patent No.: US 10,069,486 B1
(45) Date of Patent: Sep. 4, 2018

(54) MULTIMODE REGISTERS WITH PULSE LATCHES

(71) Applicant: Xilinx, Inc., San Jose, CA (US)

(72) Inventors: Benjamin S. Devlin, San Francisco, CA (US); Ilya K. Ganusov, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/196,466

(22) Filed: Jun. 29, 2016

(51) Int. Cl.
  *H03K 3/289* (2006.01)
  *H03K 3/3562* (2006.01)
  *H03K 3/037* (2006.01)

(52) U.S. Cl.
  CPC ....... *H03K 3/35625* (2013.01); *H03K 3/0372* (2013.01)

(58) Field of Classification Search
  CPC .......................... H03K 3/35625; H03K 3/0372
  USPC ......................................................... 327/203
  See application file for complete search history.

(56) References Cited

U.S. PATENT DOCUMENTS

| | | | | |
|---|---|---|---|---|
| 7,038,494 B2 * | 5/2006 | Morton | .......... | G01R 31/318541 326/93 |
| 7,246,287 B1 * | 7/2007 | Chua-Eoan | .... | G01R 31/318536 714/724 |
| 7,768,294 B2 * | 8/2010 | Shimazaki | ..... | G01R 31/318575 326/16 |
| 8,484,523 B2 * | 7/2013 | Ramaraju | ............. | G06F 11/267 714/731 |
| 8,717,078 B2 * | 5/2014 | Idgunji | ................ | H03K 3/0375 327/202 |
| 9,291,674 B1 * | 3/2016 | Lu | ....................... | G01R 31/3177 |
| 2016/0365856 A1 * | 12/2016 | Ye | ...................... | H03K 3/35625 |

OTHER PUBLICATIONS

U.S. Appl. No. 14/835,571, dated Aug. 25, 2015, Devlin et al., Xilinx, Inc., San Jose, USA.

* cited by examiner

*Primary Examiner* — Ryan Jager
(74) *Attorney, Agent, or Firm* — LeRoy D. Maunu (57) ABSTRACT

A register circuit includes a first pulse-latch circuit configured to store data from a first input node. A multiplexer circuit is configured to select between an output of the first pulse-latch circuit and a second input node. A second pulse-latch circuit is configured to store data provided by the multiplexer circuit. A control circuit is configured to switch, in response to a configuration signal, the register circuit between a flip-flop mode and a dual-latch mode.

16 Claims, 7 Drawing Sheets

MULTIMODE REGISTERS WITH PULSE LATCHES

TECHNICAL FIELD

The disclosure generally relates to multimode registers, and more particularly to registers that can be configured to operate in more than one mode using pulse latches.

BACKGROUND

There are a variety of different applications that can use configurable routing logic including, but not limited to, programmable integrated circuits, programmable logic devices (PLDs), and System on Chip (SoC) devices. Some SoC devices can include programmable logic that is similar to programmable logic provided by various PLDs. PLDs are a type of programmable integrated circuit (IC) that can be programmed to perform specified logic functions. One type of PLD, the field programmable gate array (FPGA), can include an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay locked loops (DLLs), bus or network interfaces such as Peripheral Component Interconnect (PCI), PCI Express (PCIe) and Ethernet, and so forth. Routing logic blocks provide connectivity between programmable tiles and their components. The routing logic can be configured to store data being transferred between tiles in one or more registers. As the size of the routing logic increases and certain routing architectures are used, the physical area consumed by the registers can become significant.

These and other problems can be problematic for IC design and their uses.

SUMMARY

A number of implementations are directed toward a device that includes a register circuit. The register circuit includes a first pulse-latch circuit configured to store data from a first input node; a multiplexer circuit is configured to select between an output of the first pulse-latch circuit and a second input node; and a second pulse-latch circuit is configured to store data provided by the multiplexer circuit. A control circuit is configured to switch, in response to a configuration signal, the register circuit between a flip-flop mode and a dual-latch mode.

Particular implementations are directed toward a method that includes receiving a configuration signal specifying a particular mode selected from the group consisting of a flip-flop mode and a dual-latch mode; and switching, in response to the configuration signal, a register circuit to the particular mode. The register circuit is configured to use, for the flip-flop mode, a single data input for both a first and second pulse-latch circuit, and to use, for the dual-latch mode, a respective and different data input for each of the pulse-latch circuits.

Various implementations include a device that has a register circuit. The register circuit includes a first pulse-latch circuit configured to store data from a first input node. A first multiplexer circuit is configured to select between, the first input node, an output of the first pulse-latch circuit and a second input node. A second pulse-latch circuit is configured to store data provided by the multiplexer circuit. A second multiplexer circuit is configured to select between the output of the first pulse-latch circuit and an output of the second pulse-latch circuit. A control circuit is configured to switch, in response to a configuration signal, the register circuit between a single-edge triggered flip-flop mode, a dual-edge-triggered flip-flop mode, and a dual-latch mode.

Other features will be recognized from consideration of the Detailed Description and Claims, which follow.

BRIEF DESCRIPTION OF THE DRAWINGS

Various aspects and features of the method, device, and system will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations are directed toward register circuits that use pulse latches to provide multiple register functions, which can be useful in the context of routing logic within an IC. The register circuits can be configured to operate in multiple different modes depending upon configuration settings for the register circuits. For example, a register circuit can be configured to operate as a single flip-flop in a first mode and as two separate latches or registers in a second mode.

Certain implementations are directed toward multiple uses of pulse-latch circuitry to provide an increased density of registers for programmable logic routing solutions. For instance, multiple pulse-latches can be used to provide dual-edge triggering for a single flip-flop. By changing the configuration settings of the IC, the same pulse-latches can be reused to provide individual latches with separate register storage capabilities.

According to particular implementations, a register in a flip-flop mode can function in either a dual-edge-triggered flip-flop mode or a single-edge-triggered flip-flop mode, depending upon a corresponding configuration setting. For example, two pulse-latch circuits can be arranged in a combination that provides dual-edge-triggered capabilities. The dual-edge capability can be accomplished by having one latch that is activated by a positive clock signal and the other latch that is activated by a negative clock signal and then selecting between the outputs of the two pulse-latch circuits. The two pulse-latch circuits can also be used separately by having each latch triggered by a positive clock pulse and tied to separate input and output nodes.

Various implementations are directed toward the use of register circuits within the context of routing logic of a PLD or SoC. A number of different factors, including techniques used to improve performance and area on high speed designs, contribute to a need for high flip-flop density in some instances. Depending upon the particulars of a programmable logic solution, the clocking speed may be more important than the flip-flop density. Accordingly, aspects of the present disclosure allow for a fast (dual-edge) flip-flop (FF) to be optionally split into two separate registers.

An example of a technique used to improve performance of programmable logic is the use of logic folding. Logic folding combines logic that is identical between modules by reusing the same logic for use by the different modules in order to reduce area. The shared logic is operated at an increased frequency, which allows for time sharing access to the logic. Logic folding can also reduce circuit area and wire length, which can improve performance of a design. Assuming that the output from each time sharing operation is stored, then separate registers are required for each potential module/fold. In other words, if a programmable logic block can be shared with two different modules, two registers would be implemented at the output of the programmable logic block (one for each module). The result can be an increased density for the registers, relative to programmable logic blocks that are not designed for logic folding.

An example of another technique is pipelining of logic functions. By breaking the logic functions into smaller operations, the operating frequency can be increased, which can increase data throughput. A side effect of pipelining is that it can increase input-to-output cycle latency. Feed-forward paths can be pipelined to increase performance, but certain types of logic are not easily pipelined (e.g., logic with feedback loops). Adding a pipeline stage to a critical path can require pipelining of other parallel paths so that interrelated timing dependencies can be maintained. The timing requirements can lead to the use of a large number of additional registers, which can increase the density of the registers.

Yet another example technique is time-borrowing, where skew of a clock that is used by the registers can be controlled on time-critical paths. Time-borrowing can be used to compensate for flip-flops that are not physically located in an ideal location. By introducing an intentional skew to the clock of the flip-flops, timing requirements can be met by making the flip-flops appear to be located at a different location (e.g., virtually moving a flip-flop to the middle of a long interconnect). In particular examples, the skew can be introduced by generating clock pulses with a desired width relative to the original clock edge. As a result, a time-borrowing circuit can produce an output clock that has less than a 50% duty cycle.

Consistent with various implementations, a control circuit provides the logical functions that allow the register circuits to switch between different modes of operation. In particular implementations, the control logic is shared between multiple register circuits. For example, the control circuit can be shared between groups of four register circuits, which can also share the same clock enable signal.

Figure 1:
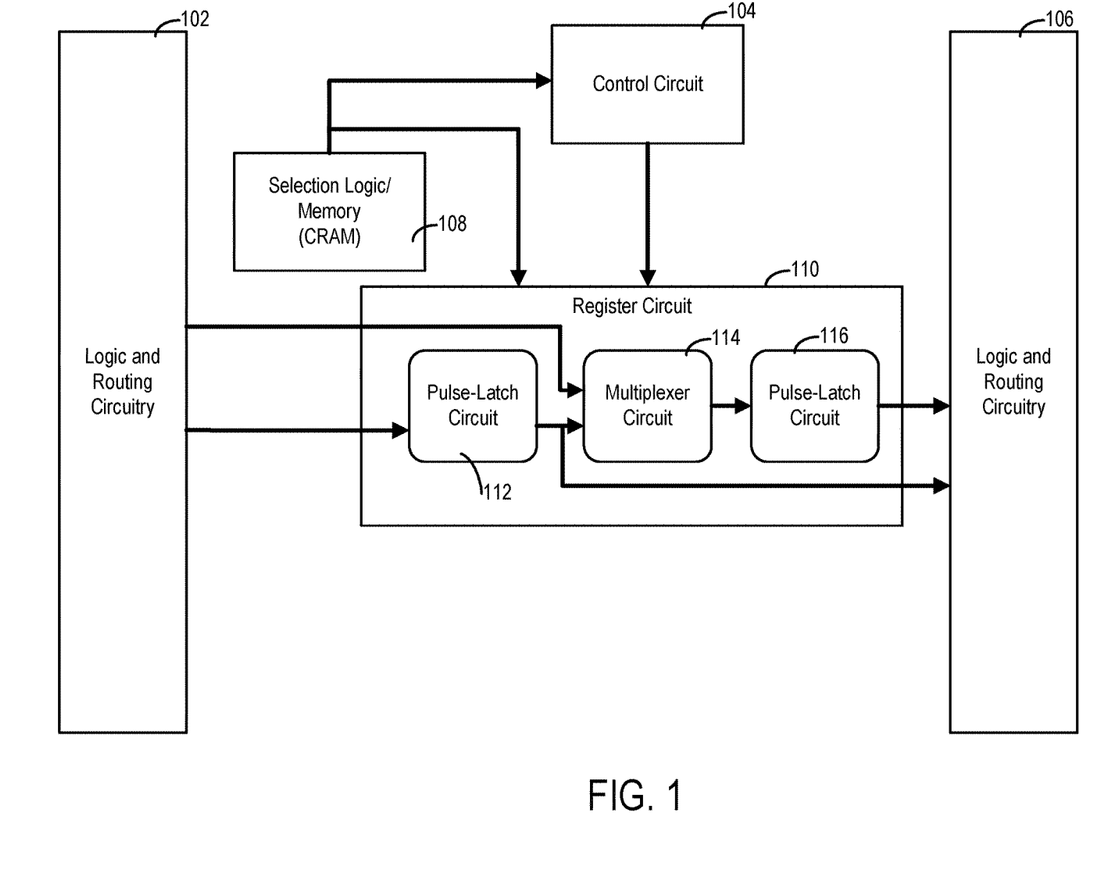
FIG. 1 is a block diagram for a system with a register circuit, consistent with various implementations of the present disclosure.

Turning now to the figures, FIG. 1 is a block diagram for a system with a register circuit, consistent with various implementations of the present disclosure. The register circuit 110 receives and stores data from logic and routing circuitry 102. The output(s) of the register circuit 110 is provided to the logic and routing circuitry 106. Consistent with various implementations discussed herein, the register circuit 110 is configured to operate in multiple modes. In a first mode, the register circuit 110 operates as a single flip-flop by configuring each of the pulse-latch circuits 112 and 116 to store data from a single data input and to provide a single data output. In some implementations, the single flip-flop can be dual-edge triggered, e.g., by activating each of the pulse-latch circuit 112, 116 on different clock phases and by selectively outputting data from the appropriate pulse-latch circuit. In the second mode, the register circuit 110 can operate as two separate latches by operating the pulse-latch circuits in a parallel configuration with two different data inputs and two different data outputs, thereby operating like two separate registers or flip-flops.

According to various embodiments, the first (flip-flop) mode can be separated into two modes, a dual-edge-triggered flip-flop mode and a single-edge-triggered flip-flop mode.

Consistent with certain implementations, the pulse-latch circuits 112, 116 can be used together to provide the functionality of a single, edge-triggered flip-flop. For example, the latched data value of pulse-latch circuit 112 is updated when the clock signal is at a low voltage, and the latched data value of the pulse-latch circuit 116 is updated when the clock signal is at a high voltage. Multiplexer circuit 114 provides the output of pulse-latch circuit 112 to the input of pulse-latch circuit 116 so that data appears on the output, and is stored in register circuit 110, upon a positive (low-to-high clock) clock transition/edge. In certain implementations, register circuit 110 can be responsive to a negative clock transition/edge. In still other implementations, register circuit 110 can be configured to store data on both negative and positive clock edges as discussed in more detail herein.

Selection logic/memory circuit 108 can store data indicating the desired configuration for register circuit 110. The stored data can be provided to register circuit 110 and to a control circuit 104. In certain implementations, control circuit 104 generates and provides appropriately-timed (based upon the indicated mode) clock signals and clock pulses to the pulse-latch circuit 112, 116.

Consistent with various implementations, the logic and routing circuitry 102 and 106 can be part of the programming logic and routing fabric of a programmable logic device. For example, the register circuit 110 can be used either to store data from look up table (LUT) outputs or bypass pin inputs. The ability to have multiple modes for the register circuit 110 provides an additional functional register while preserving the original the functionality of the corresponding configurable logic element (CLE).

In certain implementations, the selection logic/memory circuit 108 can be implemented as part of a configuration random access memory (CRAM) circuit that stores configuration data of the programmable logic device. In certain implementations, a programmable logic device can share the control circuit 104 with multiple register circuits 110. The memory circuit 108 can configure the register circuits 110 in their corresponding groups.

Figure 2:
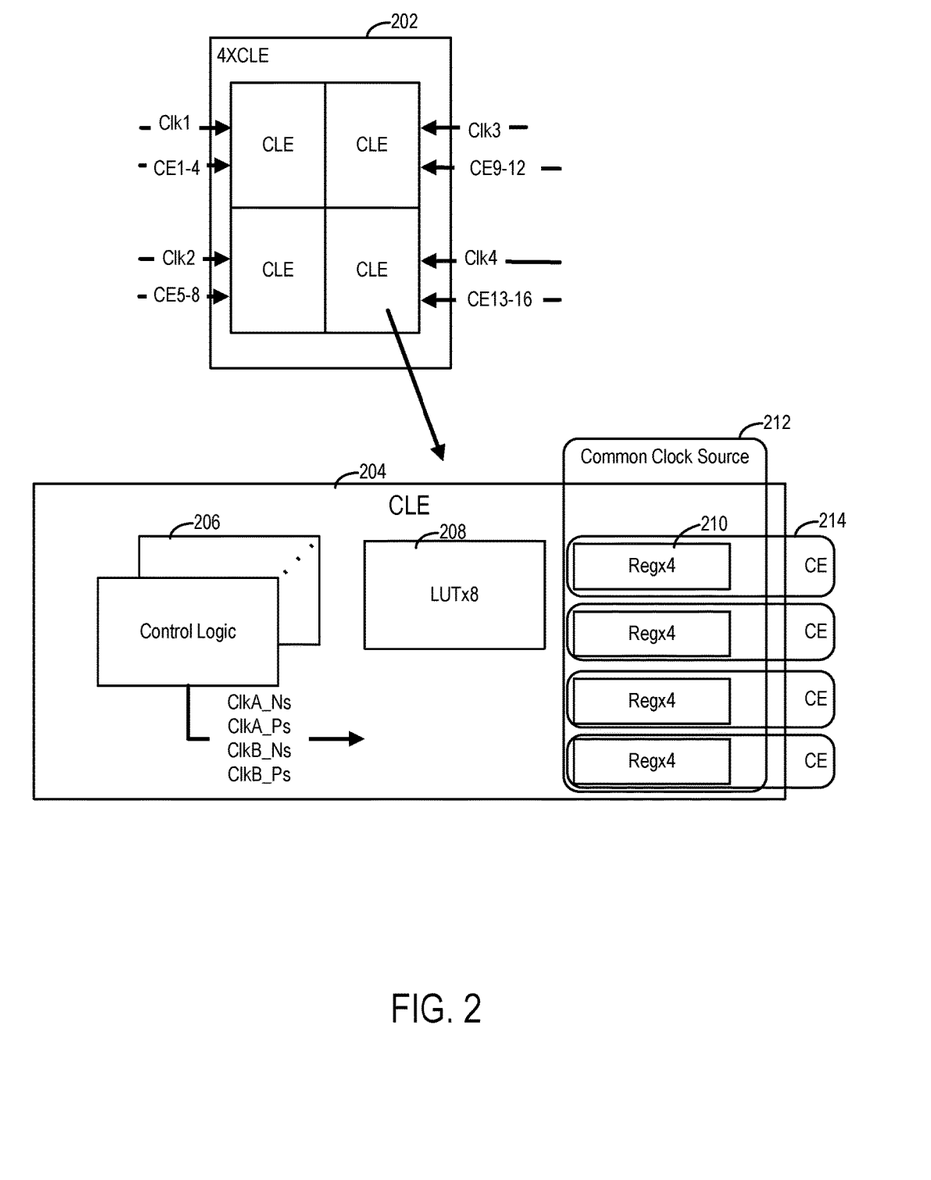
FIG. 2 depicts a block diagram showing a possible grouping of control logic circuits in the context of a programmable logic device, consistent with implementations of the present disclosure.

FIG. 2 depicts a block diagram showing a possible grouping of control logic circuits in the context of a programmable logic device, consistent with implementations of the present disclosure. Region 202 shows a grouping of four configurable logic elements (CLEs). Each CLE is depicted as having a respective clock signal (Clk1, Clk2, Clk3, and Clk4). Multiple clock enable (CE) signals are provided for each CLE, where the CEs provide control for one or more register circuits within the CLEs.

Region 204 shows a block diagram for elements of an individual CLE. While FIG. 2 depicts groups of 4 register circuits, other sizes of the groupings are possible. Region 212 shows that the register circuits 210 can share a common clock signal, while CE regions 214 shows that multiple CE signals can be used to control smaller groupings of register circuits 210 (depicted as groups of four registers). Control logic 206 generates a set of clock signals (ClkA_N, ClkA_P, ClkB_N, and ClkB_P) for each group of one or more the register circuits 210. The clock signal can be generated from the common CLE clock signal (Clk1-Clk4). According to particular implementations, the ClkA signals are provided to a first (master) pulse-latch circuit and the ClkB signals are provided to a second (slave) pulse-latch circuit. The control logic 206 can change the respective timings between the clocking signals, ClkA and ClkB, based upon the mode for the corresponding set of registers 210.

According to certain implementations, programmable logic can be provided in the form of LUTs 208. The LUTs 208 represent a simplified depiction of an example for programmable logic and are not meant to be limiting. For example, the LUTs 208 can also be linked to additional logic circuitry, such as carry logic made up of an adder circuit and multiplexer circuits. Moreover, the LUT circuit 208 can include multiple levels of smaller LUTs that are collectively used to provide programmable logic functions. The output of the LUTs is provided to the corresponding register circuit 210. Control logic 206 can control the timing for when, and how, the output is stored in the register circuits 210. Depending upon the device architecture, the register circuits 210 can receive data from one or more additional sources. For example, data inputs to the CLE in region 204 could be directly provided to the register circuits 210, thereby bypassing the LUT 208.

Figure 3:
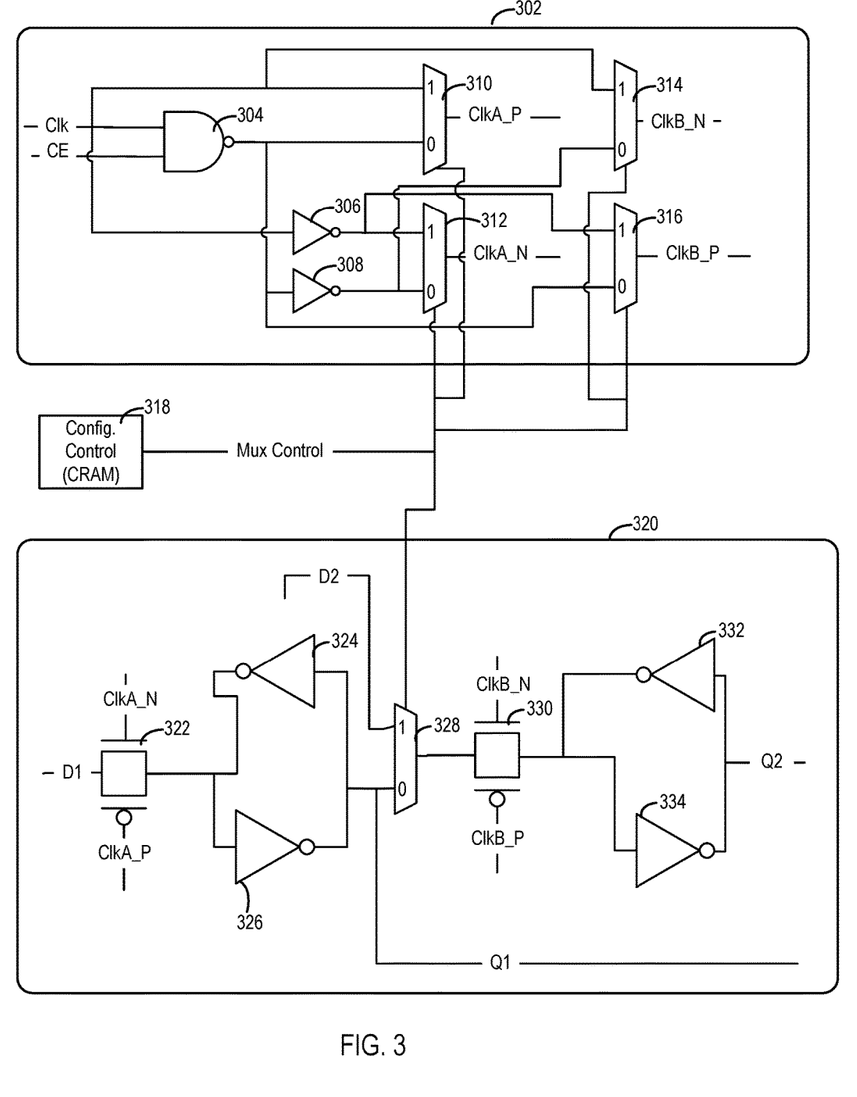
FIG. 3 is a block diagram for a control circuit and a register circuit, consistent with implementations of the present disclosure.

FIG. 3 is a block diagram for a control circuit and a register circuit, consistent with implementations of the present disclosure. Clock control circuit 302 receives, as inputs, a clock signal (Clk), a clock enable signal (CE), and a mux control signal. The control circuit 302 includes logic circuitry that generates two sets of output clock signals ClkA_P, ClkA_N and ClkB_P, ClkB_N. These two sets of clock signals can be used to control the gating of pulse-latch circuits, consistent with the discussion of FIG. 2. The particular example of logic circuitry uses a NAND gate 304, two inverters 306, 308, and four multiplexer circuits 310, 312, 314, 316.

Configuration control circuit 318 generates the mux control signal based upon the desired configuration for the register circuit 320. According to certain implementations, the configuration control circuit 318 can be a configuration random access memory (CRAM) circuit that stores configuration bits as part of a programmable logic circuit. In response to a first value of the mux control signal, the sets of output clock signals are inverted versions of one another (phase offset by ~180°), which allows the register circuit 320 to operate in a single flip-flop mode. In response to a second value of the mux control signal, the sets of output clock signals are synchronized, which allows the register circuit 320 to operate in a dual-latch/register mode.

In particular implementations, the output clock signals from the clock control circuit 302 can be shared by groups of register circuits 320. For example, an example discussed in connection with FIG. 2 includes groups of four register circuits. The particular number of registers in a group can vary. For instance, the number of registers in a grouping can be set to be consistent with the architecture and the register grouping size of the clock enable (CE) signal.

Register circuit 320 is configured to output a single output Q2 in the single flip-flop mode and two outputs Q1, Q2 in the dual-latch/register mode. In the single flip-flop mode, transistors 322 are configured to pass data from data input node D1 to a first (master) latch made up of inverters 324, 326 when a low Clk signal is provided (ClkA_N is high and ClkA_P is low). Multiplexer 328 is configured to provide the output of the master latch to transistors 330, which are configured to pass the output to a second (slave) latch made up of inverters 332 and 334 when a high Clk signal is provided. The result is that the master and slave latches operate in series and store data at when a low to high transition on the Clk signal occurs, to provide the function of an edge-triggered flip-flop.

In the dual-latch/register mode, multiplexer 328 is configured to provide a second input signal D2 to the transistors 330. The configuration can allow for each of the first and second latches to operate in parallel by storing data corresponding to a respective and different input signal. As discussed in connection with clock control circuit 302, ClkA and ClkB signals can be synchronized. The synchronization results in similar timing requirements (e.g., setup and hold times) for each of the input signals D1 and D2. In certain implementations, the respective timings for the two latches could be offset to allow for variations in the timing requirements (e.g., to account for differences in the input signals).

Figure 4:
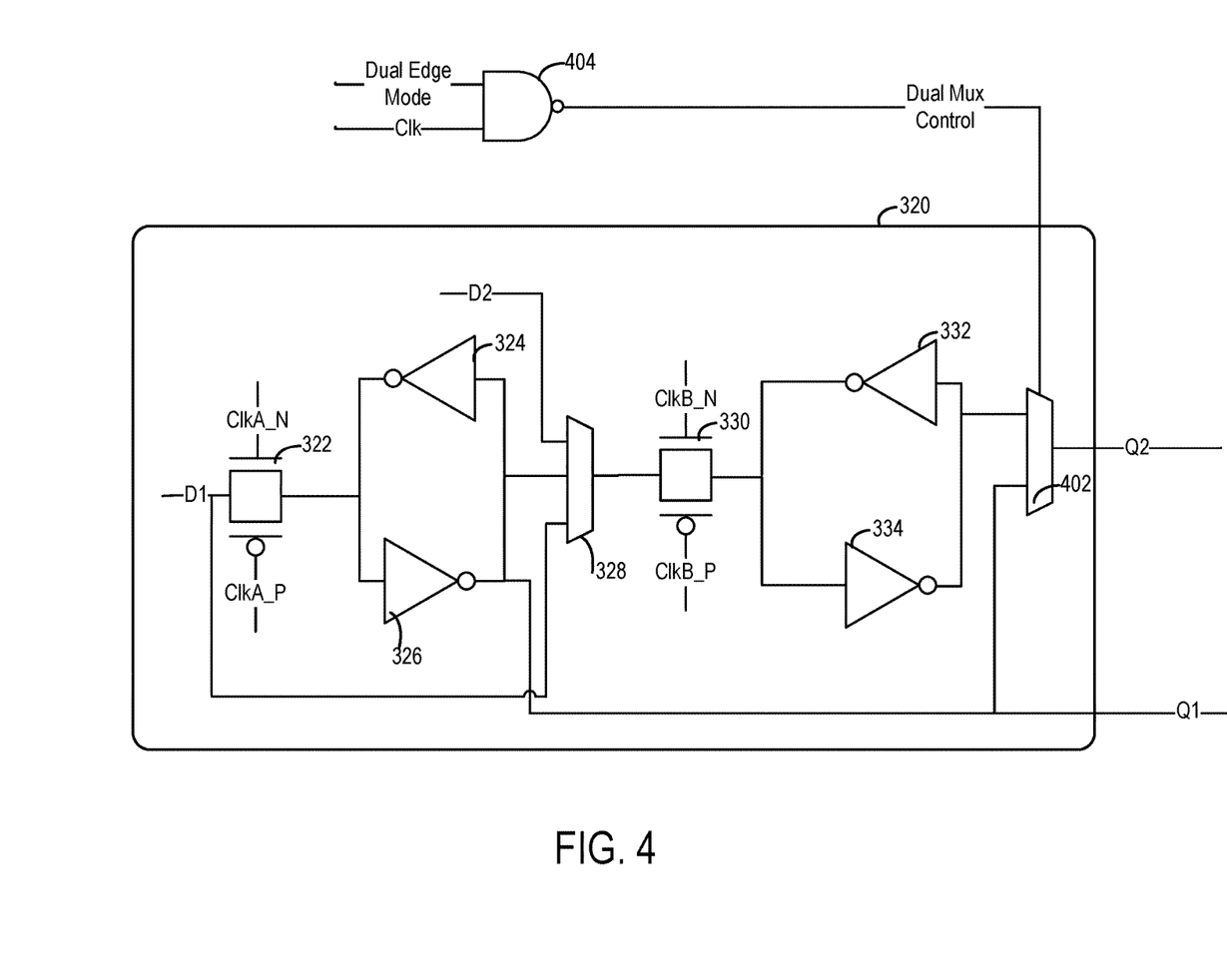
FIG. 4 depicts a block diagram for a control circuit and a register circuit with dual-edge-triggered capabilities, consistent with implementations of the present disclosure.

FIG. 4 depicts a block diagram for a control circuit and a register circuit with dual-edge-triggered capabilities, consistent with implementations of the present disclosure. Figure numbers that are also found in FIG. 3 are used to identify similar circuit components in FIG. 4. For ease of discussion, discussion of the function of the various circuit components is not repeated in each instance. Multiplexer 328 is configured to operate as a three-to-one multiplexer that selects between three different inputs based upon provided multiplexer control signals. If the register circuit 320 is operating in dual-latch/register mode, the multiplexer 328 provides the input signal D2 as an output. If the register circuit 320 is operating in single-edge-triggered flip-flop mode, then the multiplexer 328 provides the output of the first (master) pulse-latch circuit as the output of the multiplexer 328. If the register circuit 320 is operating in dual-edge-triggered flip-flop mode, then the output of multiplexer 328 provides the D1 input data signal to the second pulse-latch circuit.

In particular implementations, the multiplexer 328 is configured to respond to two input signals. The first input signal can correspond to the mux control signal discussed in connection with FIG. 3, which indicates whether the register circuit operates as two separate registers or a single flip-flop. When operating as two separate registers, the value of the second input signal can be ignored. When operating as a single flip-flop, the second input signal can control whether the flip-flop is single- or dual-edge triggered.

Multiplexer 402 can be configured to alternate between the output of the first and second pulse-latch circuits in order to provide dual-edge-triggered functionality. An example circuitry for generating a control signal for multiplexer 402 is shown by the NAND gate 404. When the dual-edge-triggered mode is high (active), the dual mux control signal alternates according to the phase of the clock signal (Clk). The output signal Q2 thereby alternates between the output of the first and second pulse-latch circuits, which are configured to latch data from the D1 data input node during opposite clock phases.

Figure 5:
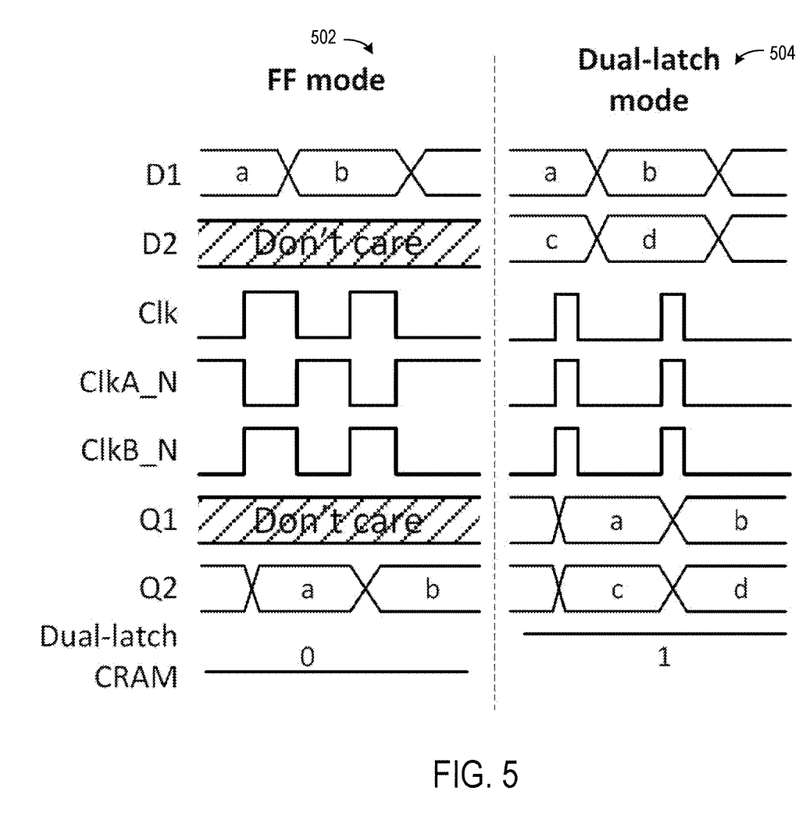
FIG. 5 depicts a signal timing diagram for a register circuit, consistent with implementations of the present disclosure.

FIG. 5 depicts a signal timing diagram for a register circuit, consistent with implementations of the present disclosure. The left side 502 represents the signals when in a flip-flop (FF) mode and the right side 504 indicates the signals when in a dual-latch mode. The modes are selectable/controlled by the value of the dual-latch CRAM signal. Values D1 and D2 correspond to the input signals D1 and D2 from the preceding figures. The values ("a," "b," "c," and "d") are arbitrary data values.

As discussed in connection with various implementations, clock control circuitry generates the ClkA_N and ClkB_N signals from the input Clk signal. For simplicity, the complementary versions of these signals (ClkA_P and ClkB_P) are not depicted.

The D2 and Q1 signals are each depicted as a "don't care" condition because only a single input and output are used in the FF mode. The value on the D1 input signal, however, appears on the Q2 input after a positive edge transition of the CLK signal. The particular manner that the timing is carried out is by way of the series configuration of the master and slave pulse-latches, which are controlled by ClkA and ClkB signals, respectively. When the Clk signal is low, the master pulse-latch circuit is active and stores the value on the D1 input. Upon a transition of the Clk signal to high, the slave pulse-latch circuit becomes active and stores the value provided by the master pulse-latch circuit. The net effect is that of a positive-edge-triggered FF.

For the dual-latch mode, the two pulse-latch circuits are configured in parallel such that the value on the D1 input is stored in a first pulse-latch circuit and the value on the D2 input is stored in a second pulse-latch circuit. The first and second pulse-latch circuits provide outputs Q1 and Q2, respectively.

The depicted waveforms show a 50% duty cycle clock (clk) for the FF mode and a less than 50% duty cycle for the dual-latch mode. The duty cycle is discussed relative to the voltage that activates the pulse-latch circuits. By inverting the clock connections to the pulse-latch circuit, the corresponding activation voltage can also be inverted. Thus, it is possible that the clock pulses could be depicted as being negative pulses with correspondingly short durations. For purposes of this disclosure, such a signal would still be considered to have a duty cycle of less than 50% because the active period is the negative portion of the waveform. Consistent with certain implementations, the short clock pulses for the dual-latch mode can be generated by the time-borrowing circuitry, which can provide configurable clock timing. The device can be configured to provide the corresponding clock signal (time borrowing or standard clock) depending upon the mode indicated by the CRAM configuration signal.

Figure 6:
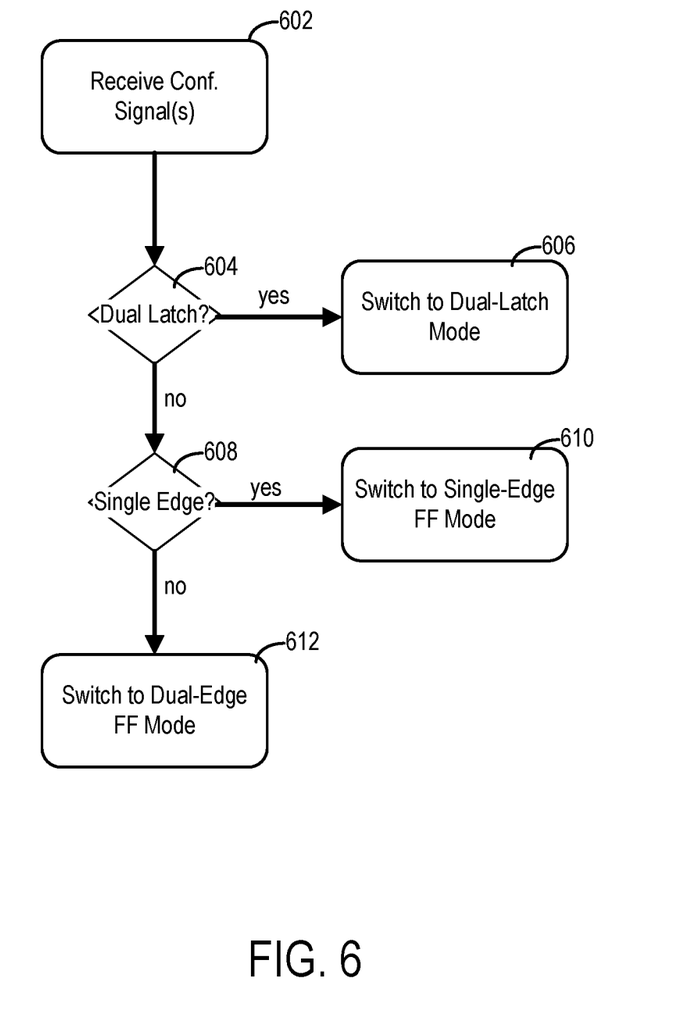
FIG. 6 depicts a flow diagram for configuring and using a register circuit, consistent with implementations of the present disclosure.

FIG. 6 depicts a flow diagram for configuring and using a register circuit, consistent with implementations of the present disclosure. The flow diagram can be used with various implementations and circuits discussed herein, including those discussed in connection with FIGS. 1-5. The flow diagram begins with the receipt of one or more configuration signals that specify a particular mode for the register circuit(s), per block 602. As discussed herein, the source of the configuration signals can be a CRAM or other circuit. The particular modes can be selected from the group consisting of a flip-flop mode and a dual-latch mode. In certain implementations, the flip-flop mode can further include a single-edge-triggered mode and a dual-edge-triggered mode.

Control circuitry, in combination with the register circuit, can be configured to respond to the configuration signals by switching to the indicated mode. When the configuration signals indicate a dual-latch mode, per block 604, then the register circuit can be switched to a dual-latch mode, as indicated by block 606. In the dual-latch mode, the first and second pulse-latch circuits each store different data using a parallel connection to respective data inputs. In the single-edge-triggered flip-flop mode, per block 608, the register circuit is configured to switch to the corresponding mode by using the first and second pulse-latch circuits in a series connection, per block 610. For the dual-edge-triggered flip-flop mode, per block 612, the register circuit is configured to switch to the corresponding mode by using the first and second pulse-latch circuits to store data from the same data input at different clock phases, as discussed in connection with FIG. 4.

As discussed in connection with the various figures, the register circuit can switch between the various modes by controlling multiplexers that control the inputs and outputs of the multiplexers. The control can change, for example, whether or not the first and second pulse-latch circuits are effectively connected in series or parallel. Moreover, the relative phases for the clock signals provided to the first and second pulse-latch circuits can be modified, consistent with the various implementations discussed herein.

Figure 7:
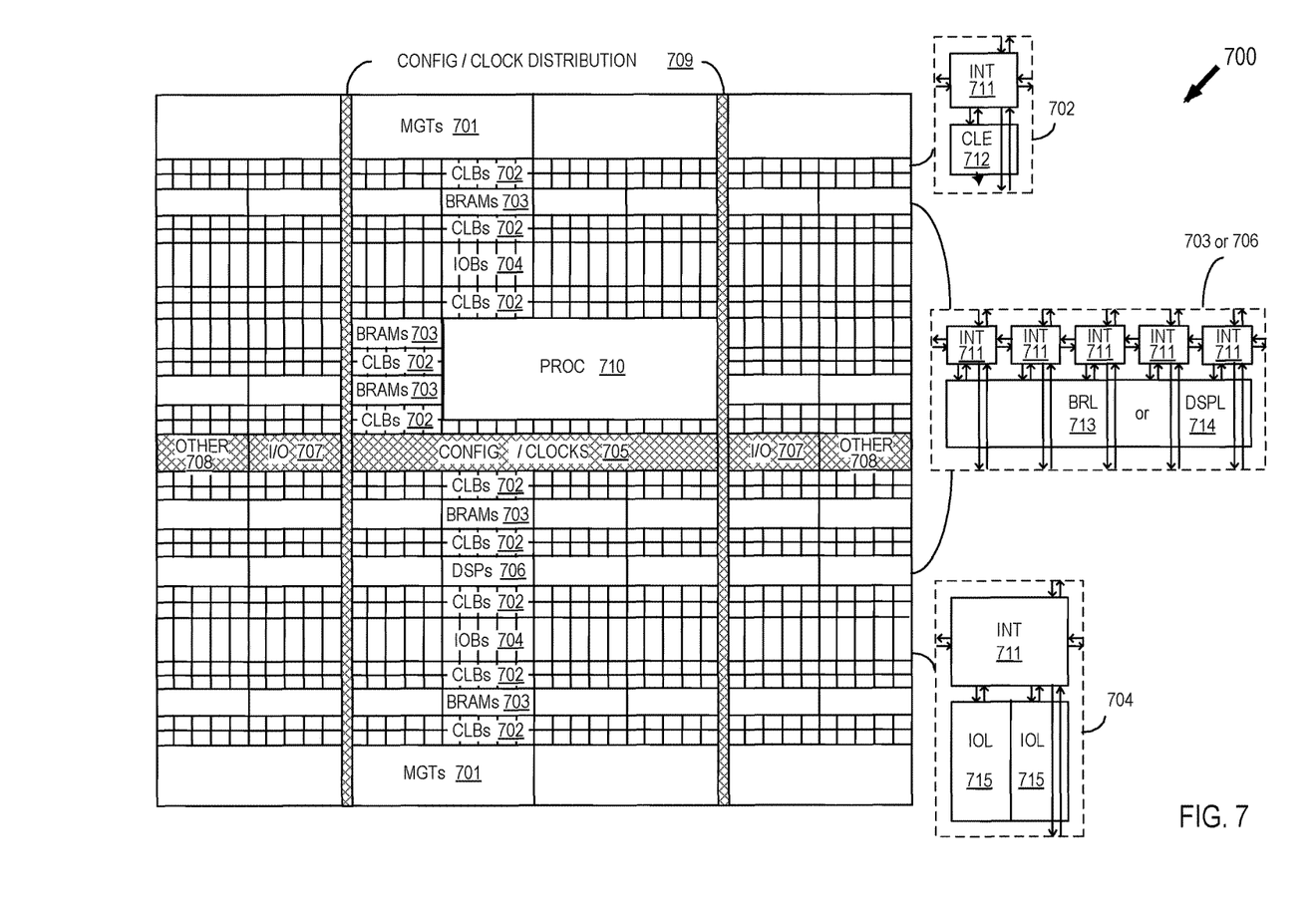
FIG. 7 shows a programmable integrated circuit (IC) 700 on which the disclosed circuits and processes may be implemented.

FIG. 7 shows a programmable integrated circuit (IC) 700 on which the disclosed circuits and processes may be implemented. The programmable IC may also be part of a chip that is sometimes referred to as a System On Chip (SOC). An SOC can include field programmable gate array logic (FPGA) along with other programmable resources. FPGA logic may include several different types of programmable logic blocks in the array. For example, FIG. 7 illustrates programmable IC 700 that includes a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707, for example, clock ports, and other programmable logic 708 such as digital clock managers, analog-to-digital converters, system monitoring logic, and so forth. Some programmable IC having FPGA logic also include dedicated processor blocks (PROC) 710 and internal and external reconfiguration ports (not shown).

In some FPGA logic, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA logic. The programmable interconnect element INT 711 also includes the connections to and from the programmable logic element within the same tile, as shown by the examples included at the top of FIG. 7. The programmable interconnect element INT 711 can include one or more register circuits that consistent with various implementations discussed herein.

For example, a CLB 702 can include a configurable logic element CLE 712 that can be programmed to implement user logic, plus a single programmable interconnect element INT 711. A BRAM 703 can include a BRAM logic element (BRL) 713 in addition to one or more programmable interconnect elements. Often, the number of interconnect elements included in a tile depends on the height of the tile. In the pictured example, a BRAM tile has the same height as five CLBs, but other numbers (e.g., four) can also be used. A DSP tile 706 can include a DSP logic element (DSPL) 714 in addition to an appropriate number of programmable interconnect elements. An IOB 704 can include, for example, two instances of an input/output logic element (IOL) 715 in addition to one instance of the programmable interconnect element INT 711. As will be clear to those of skill in the art, the actual I/O bond pads connected, for example, to the I/O logic element 715, can be manufactured using metal layered above the various illustrated logic blocks, and typically are not confined to the area of the input/output logic element 715.

In the pictured example, a columnar area near the center of the die (shown shaded in FIG. 7) is used for configuration, clock, and other control logic. Horizontal areas 709 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 7 include additional logic blocks that disrupt the regular columnar structure making up a large part of the programmable IC. The additional logic blocks can be programmable blocks and/or dedicated logic. For example, the processor block PROC 710 shown in FIG. 7 spans several columns of CLBs and BRAMs.

Note that FIG. 7 is intended to illustrate only an example programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely an example. For example, in an actual programmable IC, more than one adjacent column of CLBs is typically included wherever the CLBs appear, to facilitate the efficient implementation of user logic.

For the various flow diagrams depicted herein, the particular orders of the blocks and associated functions are provided as examples. The ordering is not necessarily limiting and can be varied according to various implementations.

Those skilled in the art will appreciate that various alternative computing arrangements, including one or more processors and a memory arrangement configured with program code, would be suitable for hosting the processes and data structures that may carry out functions disclosed herein. In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems that use RAM circuits. Other aspects and features will be apparent to those skilled in the art from consideration of the specification. The portions of the methods and system may be implemented as one or more processors configured to execute software, as an application specific integrated circuit (ASIC), or as a logic on a programmable logic device. Moreover, the various circuits identified herein may share hardware circuitry, such as use of a common computer processing unit or digital processing unit. It is intended that the specification and drawings be considered as examples only, with a true scope of the invention being indicated by the following claims.

What is claimed is:

1. A device comprising:
    a register circuit that includes:
        a first pulse-latch circuit configured to store data from a first input node;
        a multiplexer circuit configured to select between an output of the first pulse-latch circuit and a second input node; and
        a second pulse-latch circuit configured to store data provided by the multiplexer circuit, and
        a control circuit configured to:
            switch, in response to a configuration signal, the register circuit between a flip-flop mode and a dual-latch mode by controlling respective timing for clocking signals provided to each of the first and second pulse-latch circuits; and
            invert, in the flip-flop mode, clocking signals provided to the second pulse-latch circuit relative to clocking signals provided to the first pulse-latch circuit.

2. The device of claim 1, wherein the register circuit is part of programmable logic in an integrated circuit chip.

3. The device of claim 2, wherein the configuration signal is controlled by configuration data stored in a configuration random access memory.

4. The device of claim 3, wherein the multiplexer circuit includes a selection input that is controlled by the configuration data stored in the configuration random access memory.

5. The device of claim 1, wherein the control circuit is configured to provide, in the dual-latch mode, a common set of clocking signals to each of the pulse-latch circuits.

6. The device of claim 1, further comprising a time-borrowing circuit configured to generate clock pulses with less than a 50% duty cycle, and wherein the device is configured to provide the clock pulses to the register circuit in response to the configuration signal indicating the dual-latch mode.

7. The device of claim 6, wherein the device is configured to provide a clock having a 50% duty cycle in response to the configuration signal indicating the flip-flop mode.

8. A method comprising:
    storing data from a first input node in a first pulse-latch circuit;
    receiving a configuration signal specifying a particular mode selected from the group consisting of a flip-flop mode and a dual-latch mode;
    selecting, by a multiplexer, between a first signal on an output of the first pulse-latch circuit and a second signal on a second input node, and providing the selected signal as an input to and storage by a second pulse-latch circuit;

switching, in response to the configuration signal, a
register circuit including the first pulse-latch circuit and
the second pulse-latch circuit to the particular mode by
controlling respective timing for clocking signals pro-
vided to each of the first and second pulse-latch cir-
cuits; and inverting, in the flip-flop mode, clocking signals provided
to the second pulse-latch circuit relative to clocking
signals provided to the first pulse-latch circuit, wherein
the register circuit is configured to:
  use, for the flip-flop mode, a single data input from the
    first input node for both the first and second pulse-
    latch circuits and the inverted clocking signals pro-
    vided to the second pulse-latch circuit; and
  use, for the dual-latch mode, the data input from the
    first input node for the first pulse-latch circuit and a
    data input from the second input node for the second
    pulse-latch circuit.

9. The method of claim 8, wherein the particular mode is the dual-latch mode and the switching includes controlling the multiplexer circuit to select the second signal.

10. The method of claim 8, wherein the particular mode is the flip-flop mode and the respective timing for the clock signals includes an offset that causes the register circuit to function as a single-edge-triggered flip-flop.

11. The method of claim 8, further comprising providing a set of pulses from a clock skew circuit to control the first and second pulse-latch circuits in the dual-latch mode.

12. The method of claim 8, further comprising receiving another configuration signal specifying another mode and switching, in response to the another configuration signal, the register circuit to the another mode.

13. The method of claim 12, wherein the configuration signals are received from a configuration random access memory that contains data for configuring programmable logic in an integrated circuit chip that includes the register circuit.

14. The method of claim 8, further comprising providing clock pulses with less than a 50% duty cycle in response to the configuration signal indicating the dual-latch mode.

15. The method of claim 8, further comprising providing a clock having a 50% duty cycle in response to the configuration signal indicating the flip-flop mode.

16. A device comprising:
  a register circuit that includes:
    a first pulse-latch circuit configured to store data from
      a first input node;
    a first multiplexer circuit configured to select between,
      the first input node, an output of the first pulse-latch
      circuit and a second input node;
    a second pulse-latch circuit configured to store data
      provided by the first multiplexer circuit, and
    a second multiplexer circuit configured to select
      between the output of the first pulse-latch circuit and
      an output of the second pulse-latch circuit; and
  a control circuit configured to:
    switch, in response to a configuration signal, the reg-
      ister circuit between a single-edge triggered flip-flop
      mode, a dual-edge triggered flip-flop mode, and a
      dual-latch mode by controlling respective timing for
      clocking signals provided to each of the first and
      second pulse-latch circuits; and
    invert, in the single-edge triggered flip-flop mode and
      the dual-edge triggered flip-flop mode, clocking sig-
      nals provided to the second pulse-latch circuit rela-
      tive to clocking signals provided to the first pulse-
      latch circuit.

* * * * *